(12) United States Patent
Kumar et al.

(10) Patent No.: US 7,943,005 B2
(45) Date of Patent: May 17, 2011

(54) METHOD AND APPARATUS FOR PHOTOMASK PLASMA ETCHING

(75) Inventors: Ajay Kumar, Cupertino, CA (US); Madhavi R. Chandrachood, Sunnyvale, CA (US); Richard Lewington, Hayward, CA (US); Darin Bivens, San Mateo, CA (US); Amitabh Sabharwal, San Jose, CA (US); Sheeba J. Panayil, Santa Clara, CA (US); Alan Hiroshi Ouye, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1191 days.

(21) Appl. No.: 11/554,502

(22) Filed: Oct. 30, 2006

(65) Prior Publication Data

US 2008/0099431 A1 May 1, 2008

(51) Int. Cl.
*H01L 21/306* (2006.01)
(52) U.S. Cl. ............... 156/345.3; 156/345.33; 438/731
(58) Field of Classification Search ............... 156/345.3, 156/33, 34, 39, 47; 438/706, 714, 731
See application file for complete search history.

(56) References Cited

U.S. PATENT DOCUMENTS

| 4,496,420 A | 1/1985 | Frohlich et al. |
| 4,600,464 A | 7/1986 | Desilets et al. |
| 5,024,748 A | 6/1991 | Fujimura |
| 5,075,256 A | 12/1991 | Wang et al. |
| 5,556,500 A | 9/1996 | Hasegawa et al. |
| 5,593,540 A | 1/1997 | Tomita et al. |
| 5,605,637 A | 2/1997 | Shan et al. |
| 5,614,026 A | 3/1997 | Williams |
| 5,673,922 A | 10/1997 | Sherstinsky et al. |
| 5,972,781 A | 10/1999 | Wegleiter et al. |
| 6,129,808 A | 10/2000 | Wicker et al. |
| 6,167,835 B1 | 1/2001 | Ootera et al. |
| 6,190,496 B1 | 2/2001 | DeOrnellas et al. |
| 6,203,657 B1 | 3/2001 | Collison et al. |
| 6,261,406 B1 | 7/2001 | Jurgensen et al. |
| 6,270,687 B1 | 8/2001 | Ye et al. |
| 6,287,643 B1 | 9/2001 | Powell et al. |
| 6,290,806 B1 | 9/2001 | Donohoe |
| 6,299,689 B1 | 10/2001 | Wang et al. |

(Continued)

FOREIGN PATENT DOCUMENTS

EP 0488393 A2 6/1992

(Continued)

OTHER PUBLICATIONS

Notice to File a Response for Korean Patent Application No. 10-2007-0086475 dated Dec. 24, 2009.

(Continued)

*Primary Examiner* — Lan Vinh
(74) *Attorney, Agent, or Firm* — Patterson & Sheridan, LLP

(57) ABSTRACT

A method and apparatus for etching photomasks is provided herein. In one embodiment, the apparatus comprises a process chamber having a support pedestal adapted for receiving a photomask. An ion-neutral shield is disposed above the pedestal and a deflector plate assembly is provided above the ion-neutral shield. The deflector plate assembly defines a gas flow direction for process gases towards the ion-neutral shield, while the ion-neutral shield is used to establish a desired distribution of ion and neutral species in a plasma for etching the photomask.

19 Claims, 5 Drawing Sheets

U.S. PATENT DOCUMENTS

| | | | |
|---|---|---|---|
| 6,306,244 B1 | 10/2001 | Kennedy et al. | |
| 6,335,293 B1 | 1/2002 | Luo | |
| 6,339,206 B1 | 1/2002 | Johnson | |
| 6,364,949 B1 | 4/2002 | Or et al. | |
| 6,375,748 B1 | 4/2002 | Yudovsky et al. | |
| 6,521,010 B1 * | 2/2003 | Katata | 55/434 |
| 6,521,292 B1 | 2/2003 | Yudovsky et al. | |
| 6,551,447 B1 | 4/2003 | Savas et al. | |
| 6,553,332 B2 | 4/2003 | Leng | |
| 6,589,352 B1 | 7/2003 | Yudovsky et al. | |
| 6,656,322 B2 | 12/2003 | Hongo et al. | |
| 6,676,800 B1 | 1/2004 | Festa et al. | |
| 6,676,803 B2 | 1/2004 | Kim | |
| 6,692,649 B2 | 2/2004 | Collison et al. | |
| 6,782,843 B2 | 8/2004 | Kinnard et al. | |
| 6,805,779 B2 | 10/2004 | Chistyakov | |
| 6,806,651 B1 | 10/2004 | Chistyakov | |
| 6,806,949 B2 | 10/2004 | Ludviksson et al. | |
| 6,837,966 B2 | 1/2005 | Nishimoto et al. | |
| 6,868,800 B2 | 3/2005 | Moroz | |
| 6,872,259 B2 | 3/2005 | Strang | |
| 6,926,802 B2 | 8/2005 | Lee | |
| 6,949,165 B2 | 9/2005 | Koshimizu | |
| 7,037,846 B2 | 5/2006 | Srivastava et al. | |
| 7,241,345 B2 | 7/2007 | Ramamurthy et al. | |
| 7,609,002 B2 * | 10/2009 | Lee | 315/111.21 |
| 2002/0033233 A1 | 3/2002 | Savas | |
| 2002/0121501 A1 | 9/2002 | Choquette et al. | |
| 2002/0142612 A1 | 10/2002 | Wu et al. | |
| 2002/0185229 A1 | 12/2002 | Brcka et al. | |
| 2002/0189762 A1 | 12/2002 | Kim | |
| 2003/0010448 A1 | 1/2003 | Lee | |
| 2003/0019580 A1 | 1/2003 | Strang et al. | |
| 2003/0047536 A1 | 3/2003 | Johnson | |
| 2003/0094643 A1 | 5/2003 | Yang | |
| 2003/0194510 A1 | 10/2003 | Nguyen et al. | |
| 2003/0209324 A1 | 11/2003 | Fink | |
| 2003/0217812 A1 | 11/2003 | Yoshiki et al. | |
| 2004/0000535 A1 | 1/2004 | Mueller et al. | |
| 2004/0003780 A1 | 1/2004 | Yudovsky et al. | |
| 2004/0031565 A1 | 2/2004 | Su et al. | |
| 2004/0035532 A1 | 2/2004 | Jung | |
| 2004/0069227 A1 | 4/2004 | Ku et al. | |
| 2004/0079725 A1 | 4/2004 | Inomata et al. | |
| 2004/0083975 A1 | 5/2004 | Tong et al. | |
| 2004/0129226 A1 | 7/2004 | Strang et al. | |
| 2004/0140053 A1 * | 7/2004 | Srivastava et al. | 156/345.39 |
| 2004/0192043 A1 | 9/2004 | Makita et al. | |
| 2004/0212312 A1 | 10/2004 | Chistyakov | |
| 2004/0219737 A1 | 11/2004 | Quon | |
| 2004/0250772 A1 | 12/2004 | Ramamurthy et al. | |
| 2004/0261718 A1 | 12/2004 | Kim et al. | |
| 2005/0006344 A1 | 1/2005 | Tanaka | |
| 2005/0011447 A1 | 1/2005 | Fink | |
| 2005/0066902 A1 | 3/2005 | Fink | |
| 2005/0087302 A1 | 4/2005 | Mardian et al. | |
| 2005/0133164 A1 | 6/2005 | Fischer et al. | |
| 2005/0139317 A1 | 6/2005 | Wu et al. | |
| 2005/0241767 A1 | 11/2005 | Ferris et al. | |
| 2005/0263070 A1 | 12/2005 | Fink | |
| 2005/0284370 A1 | 12/2005 | Strang | |
| 2006/0000802 A1 | 1/2006 | Kumar et al. | |
| 2006/0000805 A1 | 1/2006 | Todorow et al. | |
| 2006/0060303 A1 | 3/2006 | Fink et al. | |
| 2006/0213865 A1 | 9/2006 | Honda et al. | |
| 2006/0260747 A1 | 11/2006 | Hirose et al. | |
| 2007/0000614 A1 | 1/2007 | Hatamura et al. | |
| 2007/0017898 A1 | 1/2007 | Kumar et al. | |
| 2007/0044719 A1 | 3/2007 | Ku et al. | |
| 2008/0072823 A1 | 3/2008 | Yudovsky et al. | |
| 2008/0099426 A1 | 5/2008 | Kumar et al. | |
| 2008/0101978 A1 | 5/2008 | Ryabova et al. | |

FOREIGN PATENT DOCUMENTS

| | | |
|---|---|---|
| EP | 0496564 A1 | 7/1992 |
| EP | 0522296 A2 | 1/1993 |
| EP | 0702392 A2 | 3/1995 |
| EP | 0 702 392 A | 3/1996 |
| EP | 0930642 A1 | 7/1999 |
| EP | 1024520 A2 | 8/2000 |
| EP | 1355342 A2 | 10/2003 |
| EP | 1 612 840 A | 1/2006 |
| EP | 1612840 A2 | 1/2006 |
| EP | 1686421 A2 | 8/2006 |
| JP | 62299031 A | 12/1987 |
| JP | 02-184029 A | 7/1990 |
| JP | 08-148473 A | 6/1996 |
| JP | 9115836 A | 5/1997 |
| JP | 11067727 A | 3/1999 |
| JP | 2004165298 A | 6/2004 |
| KR | 20010039233 A | 5/2001 |
| KR | 2005-0067405 A | 7/2005 |
| KR | 2006-0048674 A | 5/2006 |
| TW | 502290 B | 9/2002 |
| WO | WO-9850600 A1 | 11/1998 |
| WO | WO-03/036704 A1 | 5/2003 |
| WO | WO-03/054912 A1 | 7/2003 |
| WO | WO03054912 A1 | 7/2003 |
| WO | 2007/015504 A | 2/2007 |
| WO | WO-2007/015504 | 2/2007 |

OTHER PUBLICATIONS

Office Action dated Jan. 5, 2010 for corresponding U.S. Appl. No. 11/554,495.

Notice to File a Response from the Korean Intellectual Property Office dated Dec. 11, 2008 for corresponding Korean Patent Application No. 10-2007-0086475. A Concise Statement of Relevance is provided.

Notice to File a Response from the Korean Intellectual Property Office dated Jun. 23, 2009 for corresponding Korean Patent Application No. 10-2007-0086475. A Concise Statement of Relevance is provided.

Notice to File a Response from the Korean Intellectual Property Office dated Dec. 24, 2009 for corresponding Korean Patent Application No. 10-2007-0086475. A Concise Statement of Relevance is provided.

European Patent Office Communication pursuant to Rule 69 EPC dated Feb. 28, 2008 for corresponding European Patent Application No. 07020930.9.

Extended European Search Report for EP 07020930.9 mailed Feb. 28, 2008.

Extended European Search Report for EP 07020937.7 mailed Apr. 18, 2008.

EP Search Report, Apr. 18, 2008, consists of 9 unnumbered pages.

Official Letter dated Jun. 24, 2009 from Korean Patent Office for corresponding Korean Patent application 10-2007-0086473. A Concise Statement of Relevance is provided.

Official Letter datred Jun. 23, 2009 from Korean Patent Office for corresponding Korean Patent application 10-2007-0086475. A Concise Statement of Relevance is provided.

Chinese First Office Action dated Apr. 29, 2010 for Chinese Application No. 200710143238.X.

* cited by examiner

METHOD AND APPARATUS FOR PHOTOMASK PLASMA ETCHING

CROSS-REFERENCE TO RELATED APPLICATIONS

The subject matter of this application is related to the subject matter disclosed in U.S. patent application Ser. No. 10/880,754, entitled "METHOD AND APAPRATUS FOR QUASI-REMOTE PLASMA ETCHING", filed on Jun. 30, 2004, by Todorow, et al., and in U.S. patent application Ser. No. 10/882,084, entitled "METHOD AND APAPRATUS FOR PHOTOMASK PLASMA ETCHING", filed on Jun. 30, 2004, by Kumar, et al., and in U.S. patent application Ser. No. 11/554,495, entitled "METHOD AND APAPRATUS FOR PHOTOMASK PLASMA ETCHING", filed concurrently herewith, by Kumar, et al., all of which are hereby incorporated herein by reference in its entirety.

BACKGROUND OF THE INVENTION

1. Field of the Invention

Embodiments of the present invention generally relate to a method and apparatus for plasma etching photomasks and, more specifically, to a method and apparatus with improved control of distribution of plasma species.

2. Description of the Related Art

The fabrication of microelectronics or integrated circuit devices typically involves a complicated process sequence requiring hundreds of individual steps performed on semiconductive, dielectric and conductive substrates. Examples of these process steps include oxidation, diffusion, ion implantation, thin film deposition, cleaning, etching and lithography. Using lithography and etching (often referred to as pattern transfer steps), a desired pattern is first transferred to a photosensitive material layer, e.g., a photoresist, and then to the underlying material layer during subsequent etching. In the lithographic step, a blanket photoresist layer is exposed to a radiation source through a reticle or photomask containing a pattern so that an image of the pattern is formed in the photoresist. By developing the photoresist in a suitable chemical solution, portions of the photoresist are removed, thus resulting in a patterned photoresist layer. With this photoresist pattern acting as a mask, the underlying material layer is exposed to a reactive environment, e.g., using wet or dry etching, which results in the pattern being transferred to the underlying material layer.

The pattern on a photomask, which is typically formed in a metal-containing layer supported on a glass or quartz substrate, is also generated by etching through a photoresist pattern. In this case, however, the photoresist pattern is created by a direct write technique, e.g., with an electron beam or other suitable radiation beam, as opposed to exposing the photoresist through a reticle. With the patterned photoresist as a mask, the pattern can be transferred to the underlying metal-containing layer using plasma etching. An example of a commercially available photomask etch equipment suitable for use in advanced device fabrication is the Tetra™ Photomask Etch System, available from Applied Materials, Inc., of Santa Clara, Calif. The terms "mask", "photomask" or "reticle" will be used interchangeably to denote generally a substrate containing a pattern.

With ever-decreasing device dimensions, the design and fabrication of photomasks for advanced technology becomes increasingly complex, and control of critical dimensions and process uniformity becomes increasingly more important. Therefore, there is an ongoing need for improved process monitor and control in photomask fabrication.

SUMMARY OF THE INVENTION

The present invention generally provides a method and apparatus for etching photomasks. One embodiment provides an apparatus for plasma etching that includes a process chamber, a substrate support pedestal in the process chamber, an RF power source for forming a plasma within the chamber, a shield disposed in the chamber above the pedestal and below a plasma forming region in the chamber, the shield configured to control a distribution of ionic and neutral species of the plasma, at least one gas inlet for providing a gas flow into the chamber, and a deflector plate assembly disposed above the shield, the deflector plate assembly configured to provide a predetermined gas flow pattern between the gas inlet and the shield.

The deflector plate may also be used in processing chambers without a shield. Another embodiment provides an apparatus for plasma etching that includes, for example, a process chamber, a substrate support pedestal disposed in the process chamber, an RF power source for forming a plasma within the chamber, at least one gas inlet for providing a gas flow into the chamber, and a deflector plate assembly disposed above the substrate support pedestal and within a plasma forming region of the chamber, the deflector plate assembly configured to provide a predetermined gas flow pattern between the gas inlet and the substrate support pedestal.

Another embodiment provides a method of etching a photomask in a process chamber that includes placing a photomask on a support pedestal, providing a shield above the support pedestal inside the chamber, introducing a process gas into the process chamber through at least one inlet, providing a predetermined gas flow pattern between the gas inlet and the shield by disposing a deflector plate assembly above the shield, forming a plasma from the process gas in a region above the shield, and etching the photomask with ions and neutral species passing through the shield.

Another embodiment provides a method of etching a photomask in a process chamber that includes providing a shield above a support pedestal inside the chamber for controlling ions and neutral species passing through the shield, introducing a process gas into the process chamber through at least one inlet at a first flow velocity, providing a deflector plate assembly above the shield, the deflector plate assembly configured to provide a predetermined gas flow pattern between the gas inlet and the shield, placing a photomask on the support pedestal, forming a plasma from the process gas, etching a first photomask at the first flow velocity, obtaining an etch rate profile based on the etched first substrate, adjusting the process gas through the at least one inlet to a second flow velocity based on the etch rate profile, and etching a second photomask at the second flow velocity.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides a method and apparatus for etching of a photomask substrate by providing improved control of the gas flow pattern and plasma uniformity. The apparatus includes a deflector plate assembly configured to control the radial and vertical components of a gas flow provided in the processing chamber. The deflector plate assembly is disposed above the substrate. In one embodiment, a shield, also referred to as an ion-radical shield or ion-neutral shield, is disposed between the deflector plate assembly and the substrate. A plasma is formed in a quasi-remote, upper processing region of the chamber above the shield, which is configured for controlling the distribution of charged and neutral species in the chamber during processing.

In another embodiment, the deflector plate assembly is used to redirect the flow of gases in the processing chamber. One embodiment of the deflector plate assembly comprises a first plate having an aperture, whose location and dimension help define a primary direction of gas flow towards the substrate (or the shield, if present). In another embodiment, the deflector plate assembly further comprises a second plate disposed above the first plate. The second plate has a downwardly protruding portion that is substantially aligned with the aperture of the first plate. A gas flowing in a lateral direction, approximately parallel the first plate and the second plate, is deflected by the downwardly protruding portion and redirected through the aperture of the first plate. By establishing a primary gas flow direction or pattern or increasing the gas flow velocity in a predetermined region, the deflector plate assembly can lead to an enhanced etch rate in a predetermined location, and thus, result in improved etch uniformity.

Examples of an ion-radical shield for use in a plasma etch chamber have been disclosed in U.S. patent application Ser. No. 10/880,754, entitled "METHOD AND APPARATUS FOR PHOTOMASK PLASMA ETCHING", filed on Jun. 30, 2004, by Kumar, et al., and in U.S. patent application Ser. No. 11/554,495, entitled "METHOD AND APPARATUS FOR PHOTOMASK PLASMA ETCHING", filed concurrently herewith, by Kumar, et al., both of which are hereby incorporated by reference in their entirety.

Figure 1:
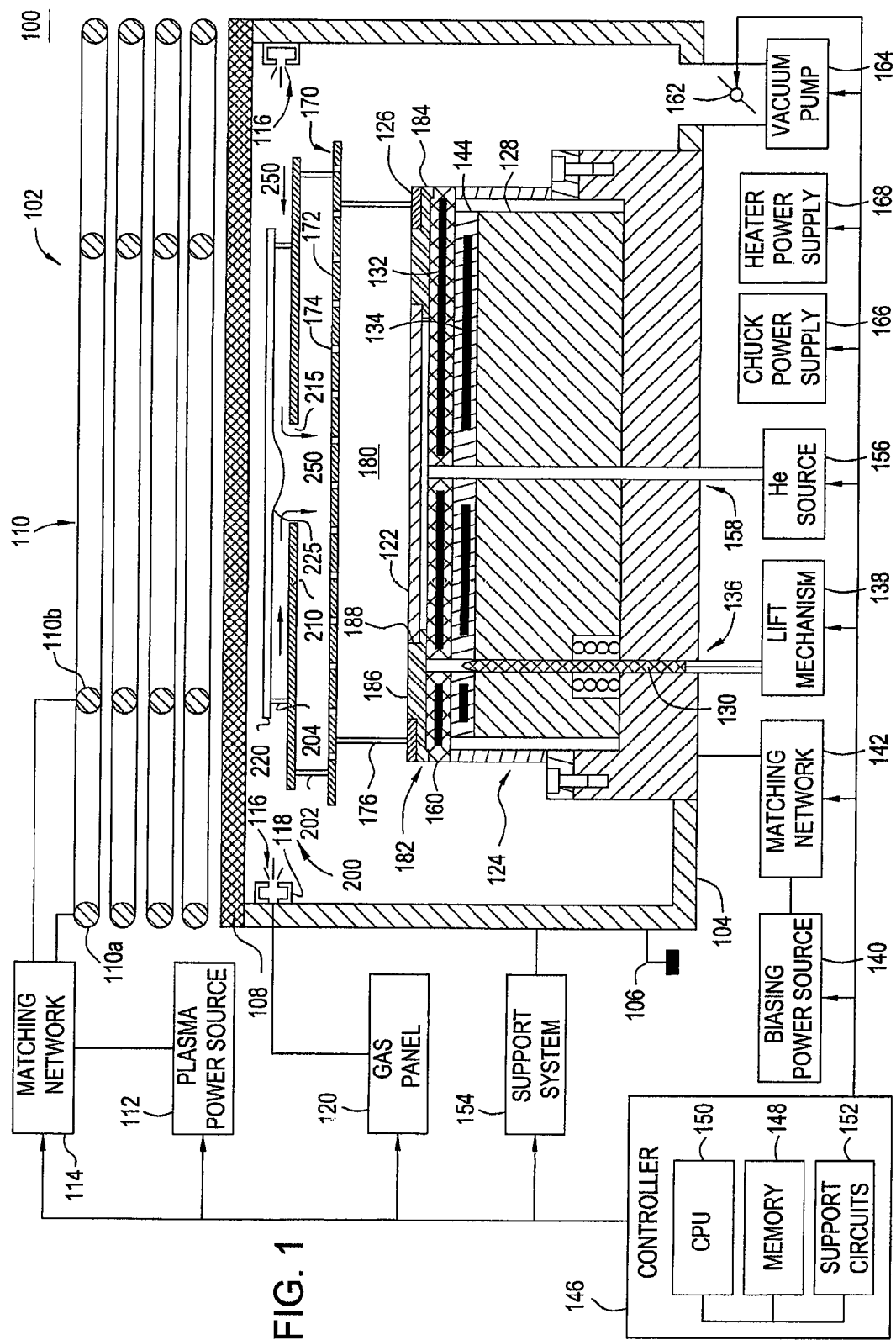
FIG. 1 is a schematic diagram of a plasma process chamber with a deflector plate assembly of the present invention.

FIG. 1 depicts a schematic diagram of an etch reactor 100 having an ion-radical shield 170. Suitable reactors that may be adapted for use with the teachings disclosed herein include, for example, the Decoupled Plasma Source (DPS®) II reactor, or the Tetra™ I and Tetra™ II Photomask etch systems, all of which are available from Applied Materials, Inc. of Santa Clara, Calif. The particular embodiment of the reactor 100 shown herein is provided for illustrative purposes and should not be used to limit the scope of the invention. It is contemplated that the invention may be utilized in other processing systems, including those from other manufacturers.

The reactor 100 generally comprises a process chamber 102 having a substrate pedestal 124 within a conductive body (wall) 104, and a controller 146. The chamber 102 has a substantially flat dielectric ceiling or lid 108. Other modifications of the chamber 102 may have other types of ceilings, e.g., a dome-shaped ceiling. An antenna 110 is disposed above the ceiling 108 and comprises one or more inductive coil elements that may be selectively controlled (two co-axial elements 110a and 110b are shown in FIG. 1). The antenna 110 is coupled through a first matching network 114 to a plasma power source 112, which is typically capable of producing up to about 3000 W at a tunable frequency in a range from about 50 kHz to about 13.56 MHz.

Processing gases are provided into the chamber 102 through one or more inlets 116 from a gas panel 120. The inlets 116 may be located on the lid 108 or wall 104 of the chamber 102. In the embodiment depicted in FIG. 1, the inlets 116 are positioned to induce a predominantly radial flow of gases entering the chamber 102, for example, through inlets 116 formed in the walls 104 of the chamber 102.

The substrate pedestal (cathode) 124 is coupled through a second matching network 142 to a biasing power source 140. The biasing source 140 generally is a source of up to about 500 W at a frequency of approximately 13.56 MHz that is capable of producing either continuous or pulsed power, Alternatively, the source 140 may be a DC or pulsed DC source. In one embodiment, the substrate support pedestal 124 comprises an electrostatic chuck 160, which has at least one clamping electrode 132 and is controlled by a chuck power supply 166. In alternative embodiments, the substrate pedestal 124 may comprise substrate retention mechanisms such as a susceptor clamp ring, a mechanical chuck, and the like.

A reticle adapter 182 is used to secure the substrate (e.g., mask or reticle) 122 onto the substrate support pedestal 124. The reticle adapter 182 generally includes a lower portion 184 that covers an upper surface of the pedestal 124 (for example, the electrostatic chuck 160) and a top portion 186 having an opening 188 that is sized and shaped to hold the substrate 122. The opening 188 is generally substantially centered with respect to the pedestal 124. The adapter 182 is generally formed from a single piece of etch resistant, high temperature resistant material such as polyimide ceramic or quartz. An edge ring 126 may cover and/or secure the adapter 182 to the pedestal 124. A lift mechanism 138 is used to lower or raise the adapter 182, and hence, the substrate 122, onto or off of the substrate support pedestal 124. Generally, the lift mechanism 162 comprises a plurality of lift pins 130 (one lift pin is shown) that travel through respective guide holes 136.

In operation, the temperature of the substrate 122 is controlled by stabilizing the temperature of the substrate pedestal 124. In one embodiment, the substrate support pedestal 124 comprises a resistive heater 144 and a heat sink 128. The resistive heater 144 generally comprises at least one heating element 134 and is regulated by a heater power supply 168. A backside gas, e.g., helium (He), from a gas source 156 is provided via a gas conduit 158 to channels that are formed in the pedestal surface under the substrate 122 to facilitate heat transfer between the pedestal 124 and the substrate 122. During processing, the pedestal 124 may be heated by the resistive heater 144 to a steady-state temperature, which in combination with the backside gas, facilitates uniform heating of the substrate 122. Using such thermal control, the substrate 122 may be maintained at a temperature between about 0 and 350 degrees Celsius (° C.).

An ion-radical shield 170 is disposed in the chamber 102 above the pedestal 124. The ion-radical shield 170 is electrically isolated from the chamber walls 104 and the pedestal 124 such that no ground path from the plate to ground is provided. One embodiment of the ion-radical shield 170 comprises a substantially flat plate 172 and a plurality of legs 176 supporting the plate 172. The plate 172, which may be made of a variety of materials compatible with process needs, comprises one or more openings (apertures) 174 that define a desired open area in the plate 172. This open area controls the amount of ions that pass from a plasma formed In an upper process volume 178 of the process chamber 102 to a lower process volume 180 located between the ion-radical shield 170 and the substrate 122. The greater the open area, the more ions can pass through the ion-radical shield 170. As such, the size of the apertures 174 controls the ion density in volume 180, and the shield 170 serves as an ion filter. The plate 172 may also comprise a screen or a mesh wherein the open area of the screen or mesh corresponds to the desired open area provided by apertures 174. Alternatively, a combination of a plate and screen or mesh may also be used.

During processing, a potential develops on the surface of the plate 172 as a result of electron bombardment from the plasma. The potential attracts ions from the plasma, effectively filtering them from the plasma, while allowing neutral species, e.g., radicals, to pass through the apertures 174 of the plate 172. Thus, by reducing the amount of ions through the ion-radical shield 170, etching of the mask by neutral species or radicals can proceed in a more controlled manner. This reduces erosion of the resist as well as sputtering of the resist onto the sidewalls of the patterned material layer, thus resulting in improved etch bias and critical dimension uniformity.

Different combinations of materials and/or configurations are provided in various embodiments of the shield plate 172. In one embodiment, the plate 172 may be made of a materials having a dielectric constant greater than about 4, including for example, ceramics such as alumina, yttria and K140 (a proprietary material available from Kyocera). In another embodiment, the plate 172 comprises two zones having at least one characteristic that is different from each other. For example, the shield may comprise a number of zones with different configurations including various geometries (e.g., sizes, shapes and open areas), and the zones may be made of the same or different materials, or be adapted to have different potential bias. By providing combinations of zone configurations, materials and/or potential bias, the spatial distribution of ions and neutrals in the plasma can be modified in a localized manner, allowing customization of process characteristics such as etch uniformity, or locally enhanced or reduced etch rates (e.g., to tailor to different pattern densities in different parts of a mask), and so on. Such a multi-zone shield, for example, can be used for active control of plasma species distribution, arid thus, allow for enhanced process control.

Figure 5A:
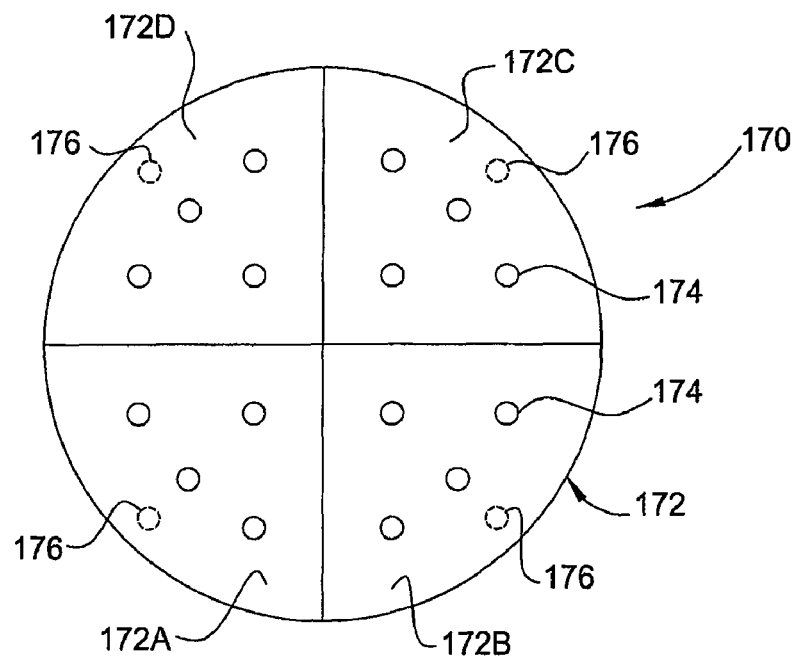
FIGS. 5A-5D illustrate schematically different embodiments of an ion-neutral shield that can be used in conjunction with the deflector plate assembly.

FIG. 5A illustrates one embodiment of a plate 172 having different zones 172A, 172B, 172C and 172D, with at least two zones being made of different materials. Suitable materials include a variety of ceramics (e.g., alumina, yttria), anodized aluminum, quartz, materials with dielectric constant higher than about 4, e.g., K140 manufactured by Kyocera. These zones can be provided in different geometric configurations or patterns, e.g., as wedges arranged in a circle (shown in FIGS. 5A), in concentric rings, in a grid or slice pattern, or other combinations of different geometric shapes.

Figure 5B:
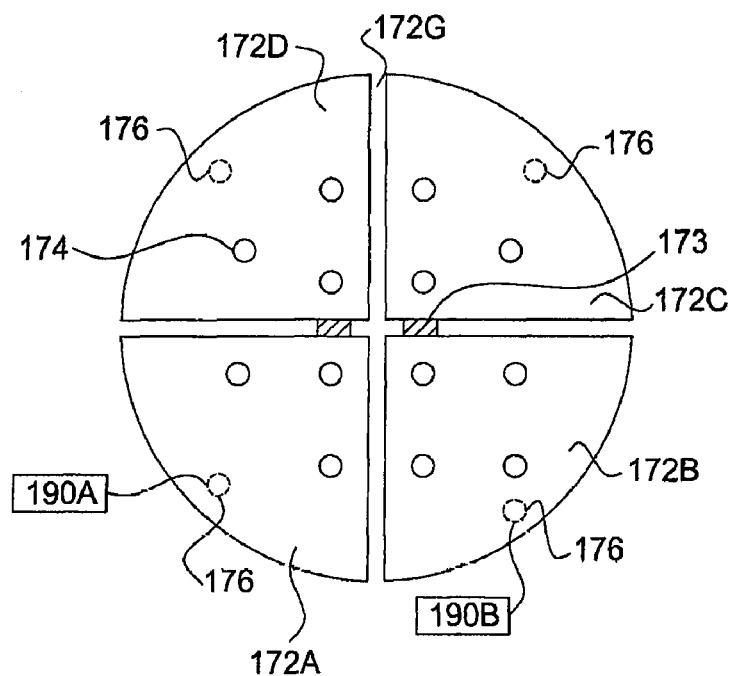
Figure 5C:
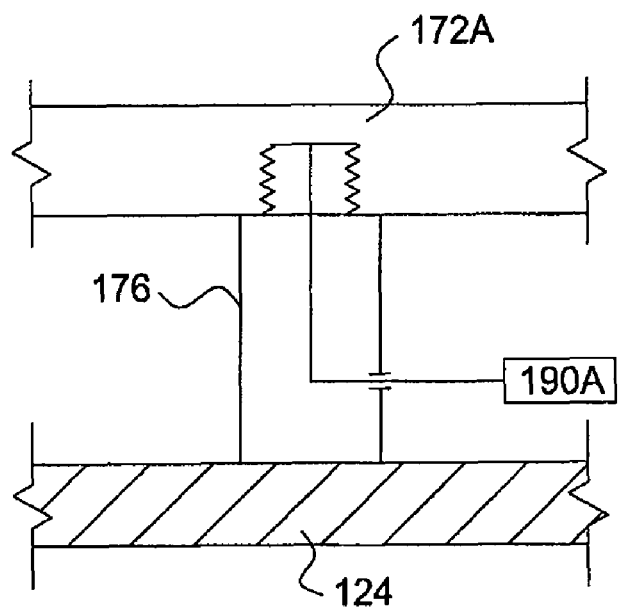

FIG. 5B illustrates another embodiment, where the plate 172 is made primarily of one material, but is divided into different zones or segments, 172A, 172B, 172C and 172D, that are physically separated or electrically isolated from each other. For example, zones of the same materials may be separated by a gap 172G, or by a different material. These zones are configured so that each can be independently biased to a different potential. As shown in FIG. 5B, zones 172A and 172B connected to respective power sources, e.g., 190A, 190B, for supplying a potential bias, which can be independently controlled for each zone. Such connection may be provided through one of the support legs 176, as shown in FIG. 5C.

Figure 5D:
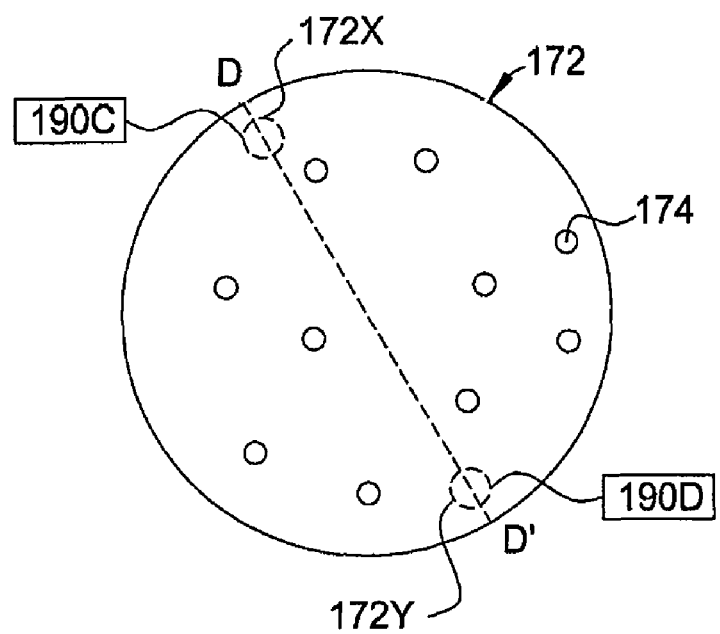

FIG. 5D shows yet another embodiment, where the plate 172 is made of one material with a potential bias applied across two locations, 172X and 172Y, on the plate 172. The potential bias is applied by connecting voltage sources 190C and 190D to the respective locations. In this embodiment, there is no gap or physical separation between the two zones of different potential bias around locations 172X and 172Y. Instead, a potential gradient is established on the plate 172 between locations 172X and 172Y.

These various embodiments of the plate 172 can be used in combination with each other, e.g., a plate, whether made of a single material or different materials, may comprise different zone configurations, or be provided with different potential bias across the plate. The various zones may also be configured to tailor to specific mask patterns so that process characteristics can be customized to suit specific needs. Thus, if a mask has regions of different pattern densities or loading, the desired etch rates for these regions may be different from each other. In that case, it is possible to configure the zones or segments on the shield plate 172 based on the specific mask patterns in order to achieve the desired etch result.

The apertures 174, which may vary in size, shape, spacing and geometric arrangement, may generally have dimensions ranging from 0.03 inches (0.07 cm) to about 3 inches (7.62 cm), and may be arranged to define an open area within each zone of the plate 172 from about 2 percent to about 90 percent. The size, shape and patterning of the apertures 174 may be varied according to the desired ion density in the lower process volume 180. For example, more apertures of small diameters in a particular zone of the plate 172 may be used to increase the radical (or neutral) to ion density ratio in a corresponding region of the volume 180. Alternatively, a number of larger apertures may be interspersed with small apertures to increase the ion to radical (or neutral) density ratio in a corresponding region of the volume 180.

The height at which the ion-radical shield 170 is supported may vary to further control the etch process. The closer the ion-radical shield 170 is located to the ceiling 108, the smaller the upper process volume 178, which tends to promote a more stable plasma. A faster etch rate may be obtained by locating the ion-radical shield 170 closer to the pedestal 124 and, therefore, the substrate 122. Alternatively, a lower, but more controlled, etch rate may be obtained by locating the ion-radical shield 170 farther from the pedestal 124. Controlling the etch rate by adjusting the height of the ion-radical shield 170 thus allows balancing faster etch rates with improved critical dimension uniformity and reduced etch bias. It is contemplated that the ion-radical shield 170 may be positioned at different heights in chambers having different geometries, for example, larger or smaller chambers.

The legs 176, which support the plate 172 in a spaced-apart relationship with respect to the substrate 122, are generally located around an outer perimeter of the pedestal 124 or the edge ring 126 and may be fabricated of the same materials as the plate 172. In one embodiment, three legs 176 are used to support the ion-radical shield 170. Although the legs 176 generally maintain the plate 172 in a substantially parallel orientation relative to the substrate 122 or pedestal 124, an angled orientation may also be used by having legs 176 of varied lengths. The legs 176 may be secured to the plate 172 by a variety of fastening methods, and may be supported on the pedestal 124, adapter 182, or the edge ring 126.

Alternatively, the plate 172 may be supported above the pedestal 124 by other means such as by using a bracket (not shown) attached to the wall 104 or other structure within the process chamber 102. In these situations, the plate 172 is generally insulated from any ground path such as the ground 106.

According to one embodiment of the present invention, a deflector plate assembly 200 is provided above the plate 172. In other embodiments where the plate 172 is absent, the deflector plate assembly 200 is disposed above the reticle adapter 182 and/or edge ring 126. In one embodiment, the deflector plate assembly 200 comprises a first plate 210 maintained in a spaced-apart relationship to the plate 172 by a first support assembly 202. The first plate 210 can be fabricated from a variety of materials compatible with the processes, e.g., ceramic, quartz, or anodized aluminum. As shown in a schematic cross-section view in FIG. 1, the first plate 210 has an aperture 215 that changes the primary gas flow direction for the plasma gases entering the chamber 102 from gas inlets 116 towards the plate 172. In one embodiment, the aperture 215 is located at the center of the first plate 210, which is also aligned with the center of the shield plate 172. In other embodiments, the aperture 215 may be disposed at other locations on the first plate 210 in order to provide desired gas flow patterns to suit specific processing needs. Furthermore, additional apertures may be provided at various locations of the first plate 210, if desired. For example, apertures having smaller diameters compared to aperture 215 may be used to provide fine tuning of the gas flow pattern.

Figure 2:
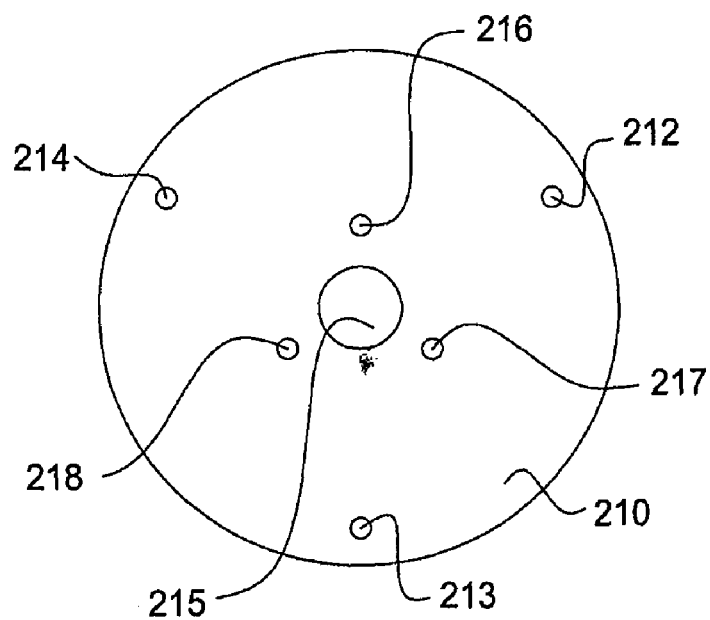
FIG. 2 is a schematic diagram of a top view of one embodiment of a plate in the deflector plate assembly of FIG. 1.

The first support assembly 202 may comprise one or more support members, e.g., a plurality of elongated members or legs, coupling the first plate 210 to the shield plate 172. The legs may be attached to the shield plate 172 and the first plate 210 by a variety of conventional means, including screws, bolts, and so on. FIG. 2 is a schematic diagram of a top view of one embodiment of the first plate 210. In one embodiment, three legs are used to attach the first plate 210 to the shield plate 172, e.g., by threading the legs to mounting holes 212, 213, 214 on the first plate 210. The vertical distance between the first plate 210 and the shield plate 172 may vary, depending on factors such as the chamber dimension, pumping configuration, gas flow requirements and specific process needs. In one embodiment, the first plate 210 is located at a distance of about 2 to 3 inches above the shield plate 172. In other embodiments, the separation distance may range from about 5 inches to about 6 inches.

In another embodiment, the deflector plate assembly 200 further comprises a second plate 220 disposed above the first plate 210. As shown in FIG. 1, the second (or top) plate 220 is supported on the first (or bottom) plate 210 by a second support assembly 204. The top plate 220 has a downwardly protruding portion 225 disposed proximate to the aperture 215 of the bottom plate 210. In one embodiment, the downwardly protruding portion 225 is located at the center of the top plate 220, and furthermore, is aligned laterally relative to the aperture 215, which has a diameter of about 50.8 mm (2 inches).

Figure 3:
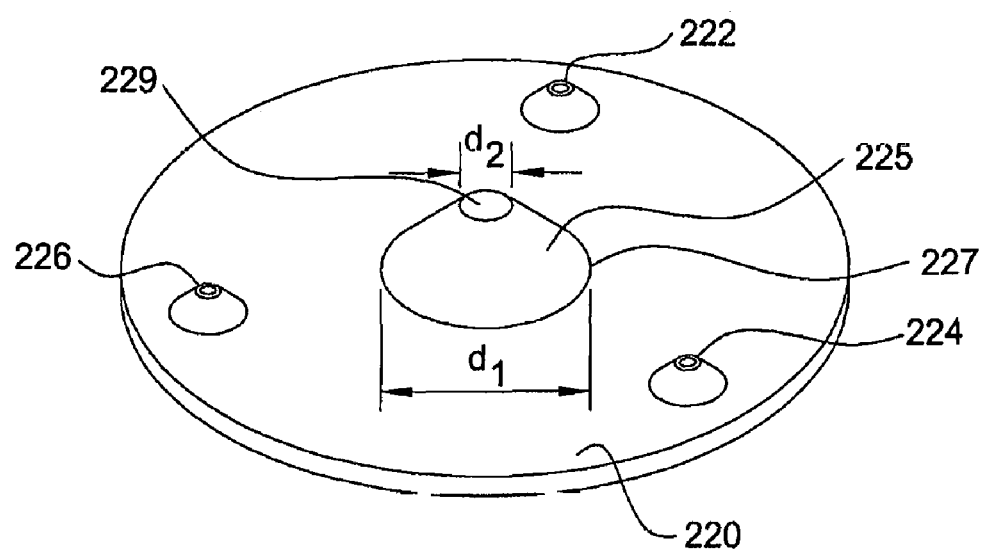
FIG. 3 is a schematic diagram of a perspective view of one embodiment of a second plate in the deflector plate assembly of FIG. 1.

FIG. 3 is a schematic illustration of a perspective bottom view of the top plate 220, showing the downwardly protruding portion 225 near the center. In this embodiment, the top plate 220 has three threaded holes 222, 224, 226 for coupling to respective support members of the second support assembly 204, which are attached at the other ends to the bottom plate 210 at mounting holes 216, 217, 218 (in FIG. 2). The downwardly protruding portion 225 generally has a cross-sectional shape similar to that of the aperture 215, e.g., a conical or truncated conical shape in the embodiment of FIG. 3. The protruding portion 225 preferably has a taper towards the center, e.g., having one end (or the base) 227 at the plane of the plate 220 wider than a far or distal end 229, i.e., dimension $d_1$ being larger than $d_2$.

In one embodiment, the top plate 220 and the bottom plate 210 is separated by a distance of about 38.1 to 50.8 mm (1.5 to 2 inches), and the aperture 215 is a circle with a diameter of about 50.8 mm (2 inches). For this configuration, simulation results show that a relatively focused vertical gas flow towards the shield and a perpendicular flow to the photomask substrate surface can be established with a side injection gas velocity ranging from about 5 m/s to about 20 m/s, although other velocities may also be used. One of the criteria for selecting certain gas flow velocities and deflector plate assembly dimensions is that a relatively focused vertical gas flow be maintained perpendicular to the ion radical shield. In other embodiments, the separation distance may range from about 25.4 to 76.2 mm (1 to 3 inches), and the aperture diameter may range from about 25.4 to 76.2 mm (1 to 3 inches). In general, the distances between the top plate 220, the bottom plate 210, and the shield plate 172, the degree of taper, shape or dimension of the protruding portion 225, as well as the shape, location and dimension of the aperture 215, may vary according to specific design and application needs, taking into considerations various factors such as the chamber dimension, pumping configuration, gas flow velocities, and so on. Aside from achieving certain desired etch rate or uniformity results, the design parameters are selected to provide a process with relatively wide margins.

Prior to plasma etching, one or more process gases are provided to the process chamber 102 from a gas panel 120, e.g., through one or more inlets 116 (e.g., openings, injectors, nozzles, and the like) located above the substrate pedestal 124. In the embodiment of FIG. 1, the gas inlets 116 are disposed above the bottom plate 210 of the deflector plate assembly 200. As shown In FIG. 1, the process gases are provided to the inlets 116 using an annular gas channel 118, which may be formed in the wall 104 or in gas rings (as shown) that are coupled to the wall 104. By appropriate choice of the gas flow velocities, the location of the deflector plate assembly 200, and the size of aperture 215, the process gases can be directed to flow primarily towards the center of the chamber 102, e.g., along the direction indicated by arrows 250. Thus, the process gases flow in a lateral direction above the bottom plate 210, e.g., radially inwards from the side gas inlets 116, and downwards through the aperture 215 of the bottom plate 210 towards the shield plate 172. In alternative embodiments in which only the first plate 210 is used, the gas inlets 116 may also be provided in other locations of the chamber 102, e.g., at the lid 108 or be centrally located on the lid 108.

When the top plate 220 is used, the gas inlets 116 are disposed at a vertical location at or below the top plate 220. In this embodiment, the gas flow between the top plate 220 and the bottom plate 210, e.g., in a radially inward direction, is deflected or re-directed by the downwardly protruding portion 225 through aperture 215. By adjusting the radial velocities of gases entering the chamber 102, the positions of the downwardly protruding portion 225 and the aperture 215, as well as the vertical locations of the top and bottom plates 220, 210, the spatial or lateral distribution of ions and neutral species passing through shield 170 can be controlled, which in turn, allows the etch rate profile to be tuned. Although the aperture 215 is centrally located on the bottom plate 210 in this illustrative embodiment, it can also be disposed at other locations, or be provided with different shapes and dimensions, in order to establish desired flow patterns that are suitable for other application needs. During an etch process, the process gases are ignited into a plasma by applying power from the plasma source 112 to the antenna 110.

The pressure in the chamber 102 is controlled using a throttle valve 162 and a vacuum pump 164. The temperature of the wall 104 may be controlled using liquid-containing conduits (not shown) that run through the wall 104. Typically, the chamber wall 104 is formed from a metal (e.g., aluminum, stainless steel, among others) and is coupled to an electrical ground 106. The process chamber 102 also comprises conventional systems for process control, internal diagnostic, end point detection, and the like. Such systems are collectively shown as support systems 154.

The controller 146 comprises a central processing unit (CPU) 150, a memory 148, and support circuits 152 for the CPU 150 and facilitates control of the components of the process chamber 102 and, as such, of the etch process, as discussed below in further detail. The controller 146 may be one of any form of general-purpose computer processor that can be used in an industrial setting for controlling various chambers and sub-processors. The memory, or computer-readable medium, of the CPU 150 may be one or more of readily available memory such as random access memory (RAM), read only memory (ROM), floppy disk, hard disk, or any other form of digital storage, local or remote. The support circuits 152 are coupled to the CPU 150 for supporting the processor in a conventional manner. These circuits include cache, power supplies, clock circuits, input/output circuitry and subsystems, and the like. The inventive method is generally stored in the memory 148 as a software routine. Alternatively, such software routine may also be stored and/or executed by a second CPU (not shown) that is remotely located from the hardware being controlled by the CPU 150.

Figure 4:
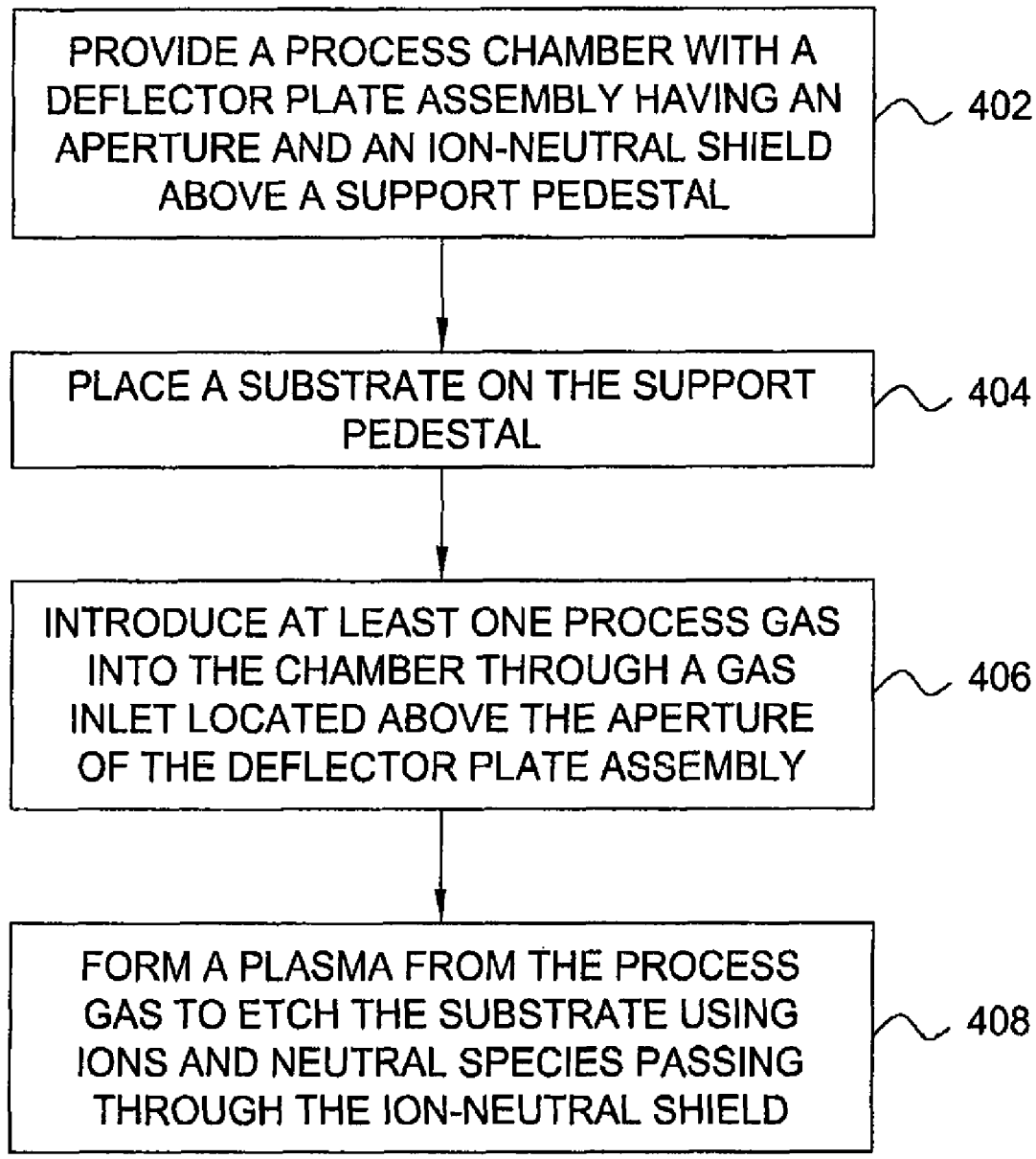
FIG. 4 is a flow chart of a method of etching a photomask according to one embodiment of the invention.

FIG. 4 illustrates a method 400 that can be used for etching a photomask substrate in an etch chamber incorporating the deflector plate assembly of the present invention. The method 400 begins at step 402 in which a process chamber is provided with a deflector plate assembly and an ion-neutral shield above a support pedestal. The deflector plate assembly has at least one aperture located above the shield.

At step 404, a substrate is placed on the support pedestal. Typical substrates generally comprise an optically transparent silicon based material, such as quartz (i.e., silicon dioxide, $SiO_2$), having an opaque light-shielding layer of metal disposed on the surface of the quartz. Typical metals used in a photomask include chromium or chromium oxynitride. The substrate may also include a layer of silicon nitride (SiN) doped with molybdenum (Mo) interposed between the quartz and chromium.

At step 406, at least one process gas is introduced into the process chamber through a gas inlet located above the aperture of the deflector plate assembly. The direction of the process gas flow towards the shield is partly defined by the aperture of the deflector plate assembly and the location of the gas inlets. For embodiments where gas inlets are provided around the perimeter region of the chamber, a gas flow is established in a radially inward direction towards the aperture, e.g., by providing an appropriate flow velocity. A second plate having a downwardly protruding portion is provided above the first plate for re-directing the gas flow downwards towards the aperture.

Exemplary process gases may include oxygen ($O_2$) or an oxygen-containing gas, such as carbon monoxide (CO), and/or a halogen-containing gas, such as a chlorine-containing gas for etching the metal layer. The processing gas may further include an inert gas or another oxygen-containing gas. Carbon monoxide is advantageously used to form passivating polymer deposits on the surfaces, particularly the sidewalls, of openings and patterns formed in a patterned resist material and etched metal layers. Chlorine-containing gases are selected from the group of chlorine ($Cl_2$), silicon tetrachloride ($SiCl_4$), boron trichloride ($BCl_3$), and combinations thereof, and are used to supply reactive radicals to etch the metal layer. In other embodiments such as those for etching quartz or MoSi, the process gases may comprise a fluorine-containing gas, e.g., trifluoromethane ($CHF_3$), tetrafluoromethane ($CF_4$), among others.

At step 408, a plasma is formed from the process gas in a process volume above the ion-radical shield, for example, by applying RF power from a plasma power source to an antenna. Ions and neutral species pass through the ion-radical shield according to a distribution pattern resulting from a combination of the process gas flow direction (as defined by the deflector plate assembly) and the potentials across the ion-radical shield. The substrate is etched by the ions and neutral species in the lower process volume.

The method and apparatus of the present invention can be used advantageously, for example, in an etch process that otherwise exhibits a radial non-uniformity such as one having a slower etch rate at the center compared to the edge. By establishing a gas flow direction or pattern or increasing the gas flow velocity in a predetermined region, e.g., the center region, the deflector plate assembly can lead to an enhanced etch rate in a corresponding region of the photomask, and thus, result in improved etch uniformity. For a given deflector plate assembly configuration within a chamber, the flow velocities of one or more process gases in various applications can also be adjusted to achieve desired etch profile or process results.

While the foregoing is directed to embodiments of the present invention, other and further embodiments of the invention may be devised without departing from the basic scope thereof, and the scope thereof Is determined by the claims that follow.

What is claimed is:

1. An apparatus for plasma etching, comprising:
a process chamber;
a substrate support pedestal disposed in the process chamber;
an RF power source for forming a plasma within the chamber;
a shield disposed in the chamber above the pedestal and below a plasma forming region in the chamber, the shield configured to control a distribution of ionic and neutral species of the plasma, wherein the shield comprising two zones having at least one characteristic different from each other, the at least one characteristic being one of material or potential bias;
at least one gas inlet disposed radially outward of the shield for providing a gas flow into the chamber in a direction parallel to the shield; and a deflector plate assembly disposed above the shield, the deflector plate assembly configured to provide a predetermined gas flow pattern between the gas inlet and the shield, wherein the deflector plate assembly comprises a first plate having an aperture.

2. The apparatus of claim 1, wherein the at least one gas inlet is disposed above the first plate.

3. The apparatus of claim 1, wherein the aperture is located at a center of the first plate and substantially aligned with a center of the shield.

4. The apparatus for claim 1, wherein the aperture is circular and has a diameter between about 25.4 mm to about 76.2 mm.

5. The apparatus of claim 1, wherein the deflector plate assembly is fabricated from at least one of ceramic, quartz, or anodized aluminum.

6. The apparatus of claim 1, wherein the support pedestal is configured for supporting a photomask.

7. The apparatus of claim 1, wherein the first plate of the deflector plate assembly is attached to the shield by a support assembly.

8. The apparatus of claim 7, wherein the first plate is supported in a substantially parallel, spaced apart relation with respect to the shield.

9. The apparatus of claim 1, wherein one of the characteristic is material.

10. The apparatus of claim 9, wherein each of the two zones comprises a material with a dielectric constant different from each other, the material being selected from the group consisting of anodized aluminum, ceramics, alumina, yttria, and materials having a dielectric constant higher than about 4.

11. The apparatus of claim 1, wherein the deflector plate assembly further comprises a second plate disposed above the first plate, the second plate having a downwardly protruding portion disposed above the aperture.

12. The apparatus of claim 11, wherein the downwardly protruding portion is substantially aligned with the aperture of the first plate.

13. The apparatus of claim 11, wherein the downwardly protruding portion has a first end at a plane of the second plate and a distal end, the first end having a lateral dimension that is larger than a lateral dimension at the distal end.

14. The apparatus of claim 13, wherein the lateral dimension at the base of the protruding portion is larger than a diameter of the aperture of the first plate.

15. An apparatus for plasma etching, comprising:
a process chamber;
a substrate support pedestal disposed in the process chamber;
an RF power source for forming a plasma within the chamber;
a shield disposed in the chamber above the pedestal and below a plasma forming region in the chamber, the shield configured to control a distribution of ionic and neutral species of the plasma, wherein the shield comprises two zones;
at least one gas inlet for providing a gas flow into the chamber; and
a deflector plate assembly disposed above the shield, the deflector plate assembly configured to provide a predetermined gas flow pattern between the gas inlet and the shield, wherein the two zones of the shield have respective potential bias different from each other.

16. An apparatus for plasma etching, comprising:
a process chamber;
a substrate support pedestal disposed in the process chamber;
an RF power source for forming a plasma within the chamber;
at least one gas inlet for providing a gas flow into the chamber;
a shield disposed in the chamber above the substrate support pedestal and below a plasma forming region in the chamber, the shield comprising two zones having respective potential bias different from each other; and
a deflector plate assembly disposed above the substrate support pedestal and within the plasma forming region of the chamber, the deflector plate assembly configured to control radial to vertical components of a gas flow pattern between the gas inlet and the substrate support pedestal in response to changes in gas velocity.

17. The apparatus of claim 16, wherein the at least one gas inlet is disposed in a sidewall of the process chamber for producing a radial gas flow.

18. The apparatus of claim 16, wherein the deflector plate assembly comprises a first plate having an aperture.

19. The apparatus of claim 18, wherein the aperture is located in a central region of the first plate.

* * * * *